US007525639B2

(12) United States Patent
Yamada

(10) Patent No.: US 7,525,639 B2
(45) Date of Patent: Apr. 28, 2009

(54) EXPOSURE APPARATUS AND METHOD, AND DEVICE MANUFACTURING METHOD USING THE SAME

(75) Inventor: Akihiro Yamada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 380 days.

(21) Appl. No.: 11/305,484

(22) Filed: Dec. 15, 2005

(65) Prior Publication Data
US 2006/0152700 A1    Jul. 13, 2006

(30) Foreign Application Priority Data
Dec. 15, 2004  (JP)  .............. 2004-362668

(51) Int. Cl.
*G03B 27/52* (2006.01)
*G03B 27/54* (2006.01)
(52) U.S. Cl. .......................... 355/55; 355/67
(58) Field of Classification Search .............. 355/55, 355/53, 52, 71, 67, 30; 700/59, 83; 359/341.1
See application file for complete search history.

(56) References Cited

U.S. PATENT DOCUMENTS

| 2003/0011756 A1* | 1/2003 | Omura et al. ............... 355/71 |
| 2004/0010385 A1* | 1/2004 | Fukuhara et al. ........... 702/83 |
| 2004/0012844 A1* | 1/2004 | Ohtsuki et al. ............ 359/341.1 |
| 2004/0059444 A1* | 3/2004 | Tsukakoshi .................. 700/59 |
| 2007/0242241 A1* | 10/2007 | Nagasaka et al. ........... 355/30 |

FOREIGN PATENT DOCUMENTS

| JP | 2003-050349 | 2/2003 |
| JP | 2004-172328 | 6/2004 |
| WO | WO 2005071717 A1 * | 8/2005 |

\* cited by examiner

*Primary Examiner*—Peter B Kim
(74) *Attorney, Agent, or Firm*—Locke Lord Bisell & Liddell LLP

(57) ABSTRACT

An exposure apparatus for exposing a pattern of a reticle onto a plate includes a projection optical system for projecting the pattern onto the plate, a switch for switching a polarization of a light for illuminating the reticle from a first polarization state to a second polarization state different from the first polarization state, and an adjuster for adjusting an aberration of the projection optical system when the switch switches the polarization of the light from the first polarization state to the second polarization state.

8 Claims, 7 Drawing Sheets

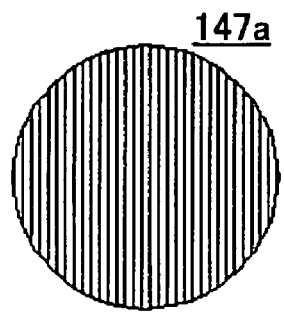 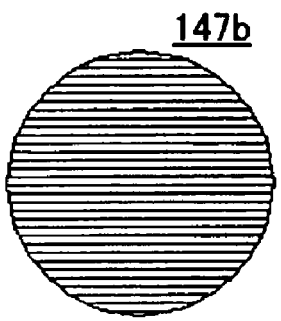 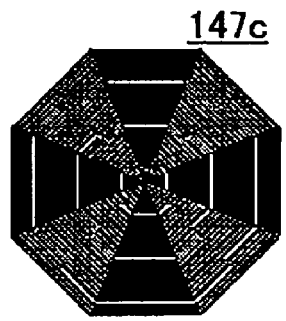 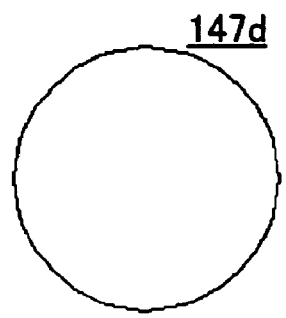
FIG. 2A      FIG. 2B      FIG. 2C      FIG. 2D
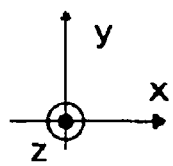
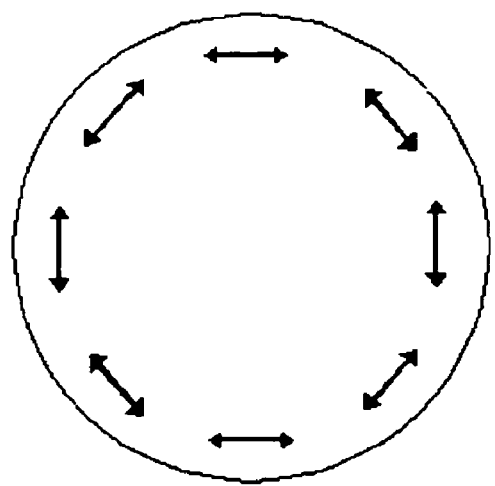
FIG. 3

FIG. 4A
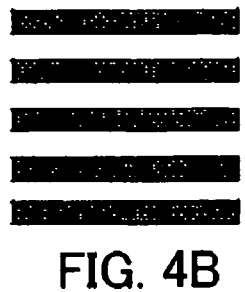
FIG. 4B
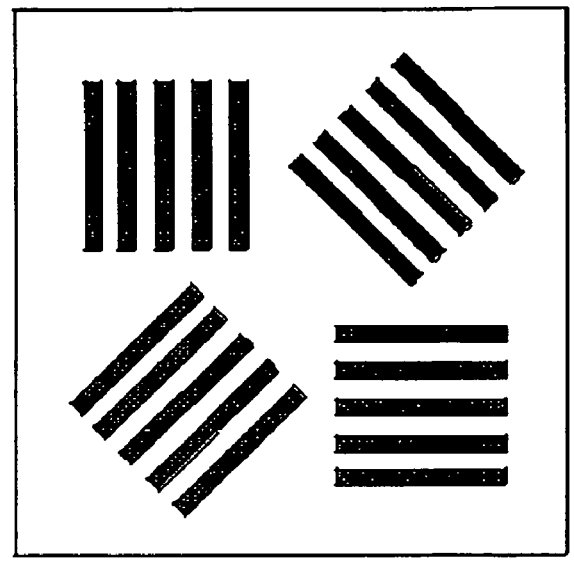
FIG. 4C
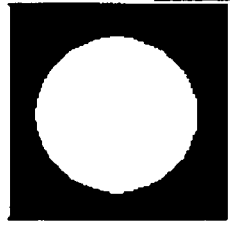
FIG. 5A
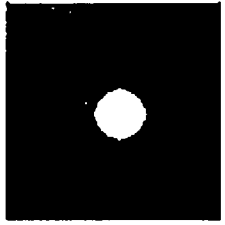
FIG. 5B
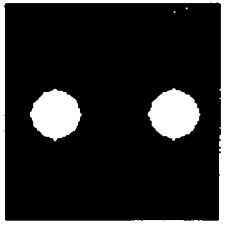
FIG. 5C
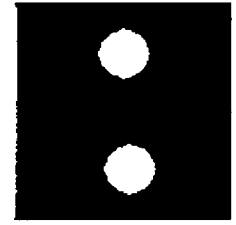
FIG. 5D
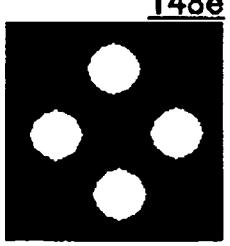
FIG. 5E
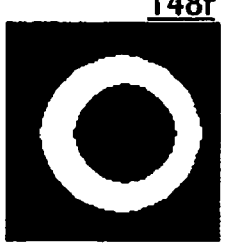
FIG. 5F
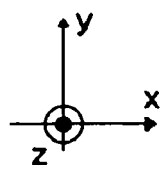

PRIOR ART

EXPOSURE APPARATUS AND METHOD, AND DEVICE MANUFACTURING METHOD USING THE SAME

BACKGROUND OF THE INVENTION

The present invention generally relates to an exposure method and apparatus, and more particularly to an exposure apparatus and method used to manufacture various types of devices including semiconductor chips, display devices, detecting devices, image-pickup devices, and a fine pattern used for the micromechanics.

The photolithography technology is used to manufacture such a fine semiconductor device as a semiconductor memory and a logic circuit, and a liquid crystal display device. The conventional photolithography technology employs a reduction projection exposure apparatus that uses a projection optical system to project a circuit pattern of a reticle or mask onto a wafer, etc. to transfer the circuit pattern.

The minimum critical dimension ("CD") transferable by the projection exposure apparatus or a resolution is proportionate to a wavelength of exposure light, and inversely proportionate to the numerical aperture ("NA") of the projection optical system. The shorter the wavelength is, the better the resolution is. Accordingly, use of the exposure light having a shorter wavelength advances with the recent demands for fine processing to the semiconductor devices, from an ultra-high pressure mercury lamp (g-line with a wavelength of approximately 436 nm) and i-line with a wavelength of approximately 365 nm) to a KrF excimer laser (with a wavelength of approximately 248 nm) and an ArF excimer laser (with a wavelength of approximately 193 nm). In addition, the high NA scheme of the projection optical system is also promoted and the projection optical system having an NA of 0.9 or greater is about to reduce to practice. Moreover, an immersion lithography is proposed which fills a space between the final lens surface of the projection optical system and the wafer with a medium having a refractive index of 1.0 or greater, such as the water, increasing an apparent NA of the projection optical system up to 1.0 or greater, and improving the resolution.

When the high NA scheme of the projection optical system proceeds, for example, when NA becomes greater than 0.9, a polarization state of the light incident upon the projection optical system tends to significantly affect the resolving power. Two perfect coherent lights interfere with each other when their electric-field vibration directions are parallel to each other, but do not interfere at all when their electric-field vibration directions are perpendicular to each other even if they are perfectly coherent.

FIG. 10 shows that two lights are incident from the air and form an image on a photosensitive material or resist PR applied on a wafer WF, where a z axis denotes the optical-axis direction, an x axis denotes a direction perpendicular to the z axis, and a y axis denotes a direction perpendicular to FIG. 10. The y-polarized light is a polarized light that has an electric-field vibration plane on the yz plane. The x polarized light is a polarized light that has an electric-field vibration plane on the xy plane. When the polarization states of both the two lights are the y-polarized light, their vibration planes are always parallel to each other, and perfectly interfere with each other. Therefore, a repetitive image with a contrast of 100% is formed on the image plane. On the other hand, when the polarization states of both the two lights are the x-polarized light, their vibration planes are not parallel to each other and do not completely interfere with each other. Therefore, a repetitive image's contrast is not 100% on the image plane.

Here, contrast C is expressed by Equation 1 below, where Imax denotes a maximum value of the light intensity, and Imin denotes a minimum value of the light intensity:

$$C=(Imax-Imin)/(Imax+Imin) \tag{1}$$

FIG. 11 shows that an angle between the two lights is greater than that in FIG. 10. Similar to the illustration in FIG. 10, when the polarization states of the two lights are the y-polarized light, their vibration planes are always parallel to each other. Thus, they interfere with each other, forming a repetitive image on the image plane with a contrast of 100%. On the other hand, when the polarization states of the two lights are the x-polarized light, the interference characteristic become worse due to the large angle between two lights than that in FIG. 10, lowering the contrast.

In FIGS. 10 and 11, the two lights are incident upon the resist applied to the wafer from the air. The air has a refractive index of 1, and the resist has a refractive index between 1.4 and 1.8. When the light is incident upon the resist from the air, the angle between the two lights decreases. In an immersion lithography that places on the resist RP a material IM having a refractive index greater than that of the air, the refractive index difference between the material IM and the resist PR is smaller than the refractive index difference between the air and the resist. Therefore, the refraction angle reduces at which the light is incident upon the material IM from the resist PR, and the angle between two lights increases.

As the NA of the projection optical system increase, control over the polarization state of the light incident upon the projection optical system becomes vital. Since an optimal polarization state differs according to reticle patterns, control or switch of the polarization state is needed according to the reticle patterns. The optical element and thin film, such as a antireflection coating and a reflection coating administered on the optical element, in the projection optical system have optical characteristics depending upon the polarization of the incident light. For example, the birefringent glass material has a different refractive index and a different aberration according to polarization directions of the incident light. In other words, the projection optical system causes a different aberration according to the polarization directions of the incident light.

Equations 2 and 3 below are met, where $WA_x$ denotes an aberration caused by the incident x-polarized light, $WA_y$ denotes an aberration caused by the incident y-polarized light, $WA_{RANDOM}$ denotes an aberration caused by the incident non- or randomly polarized light, $BWA_x$ denotes an aberration depending upon only the x-polarized light, and $BWA_y$ denotes an aberration depending upon only the y-polarized light.

$$WA_x=WA_{RANDOM}+BWA_x \tag{2}$$

$$WA_y=WA_{RANDOM}+BWA_y \tag{3}$$

The aberration depending upon only the polarization has the same absolute value but inverse codes with respect to two orthogonal, polarized lights. Therefore, Equation 4 below is met:

$$BWA_x=-BWA_y \tag{4}$$

Equations 5 and 6 are sufficient to reduce both the aberrations $WA_x$ and $WA_y$:

$$WA_{RANDOM}=0 \tag{5}$$

$$BWA_x=-BWA_y=0 \tag{6}$$

Equation 6 requires the projection optical system to reduce the birefringence down to 0. For this purpose, for example, various exposure apparatuses are proposed, which adjust the birefringence by a crystal orientation and an angle incorporated to the projection optical system, or which adjust the projection optical system to cancel out a birefringence effect of the antireflection coating. In this case, the optical system includes plural elements made of a crystalline glass material with a birefringence caused by the crystal structure. These exposure apparatuses are disclosed in Japanese Patent Applications, Publication Nos. 2003-050349 and 2004-172328.

However, due to the manufacture errors, it is difficult to correct a birefringence amount of an entire projection optical system to completely 0 even if attempted in order to correct the polarization dependent aberration in assembly and adjustment of the projection optical system. The conceivable manufacture errors include, for example, a crystal orientation of the crystalline glass material and a rotational incorporation angle, an uneven thickness of the antireflection coating, and a stress distortion applied in mounting the projection optical system on the exposure apparatus. The influence of the polarization dependent aberration simply deteriorates the contrast in the conventional non-polarized light illumination, and the influence on the imaging performance is small and negligible. However, in the polarization controlled illumination, the aberration deteriorates the contrast, causes an image shift and defocus, etc., and changes these amounts whenever a polarization state is switched.

BRIEF SUMMARY OF THE INVENTION

The present invention is directed to an exposure apparatus and method that precisely transfer a fine pattern while maintaining an imaging characteristic even when switching a polarization state of the light that illuminates an object plane having a desired pattern.

An exposure apparatus according to one aspect of the present invention for exposing a pattern of a reticle onto a plate includes a projection optical system for projecting the pattern onto the plate, a switch for switching a polarization of a light for illuminating the reticle from a first polarization state to a second polarization state different from the first polarization state, and an adjuster for adjusting an aberration of the projection optical system when the switch switches the polarization of the light from the first polarization state to the second polarization state.

An exposure apparatus according to another aspect of the present invention for exposing a pattern of a reticle onto a plate includes a projection optical system for projecting the pattern onto the plate, a detector for detecting a change of the pattern of the reticle, and an adjuster for adjusting an aberration of the projection optical system when the detector detects the change of the pattern of the reticle.

An exposure method according to another aspect of the present invention for exposing a pattern of a reticle onto a plate through a projection optical system includes the steps of detecting a change of the pattern of the reticle, obtaining a variation of an aberration of the projection optical system caused by the change of the pattern of the reticle, and adjusting the aberration of the projection optical system based on a result obtained by the obtaining step.

A device manufacturing method according to still another aspect of the present invention includes the steps of exposing a plate using the above exposure apparatus, and developing a plate that has been exposed.

Other objects and further features of the present invention will become readily apparent from the following description of the preferred embodiments with reference to the accompanying drawings.

BRIEF DESCRIPTION OF THE DRAWINGS

FIGS. 2A to 2D are schematic plane views exemplarily showing polarizers and a transmission hole on a turret of a polarizer switch shown in FIG. 1.

FIG. 3 is a schematic plane view showing a polarization state of an effective light source of the light controlled by the polarizer shown in FIG. 2C.

FIGS. 4A to 4C are schematic plane views showing illustrative reticle patterns.

FIG. 5A to 5F are schematic plane views of illustrative apertures on a turret of an aperture switch shown in FIG. 1.

DETAILED DESCRIPTION OF THE PREFERRED EMBODIMENTS

Figure 1:
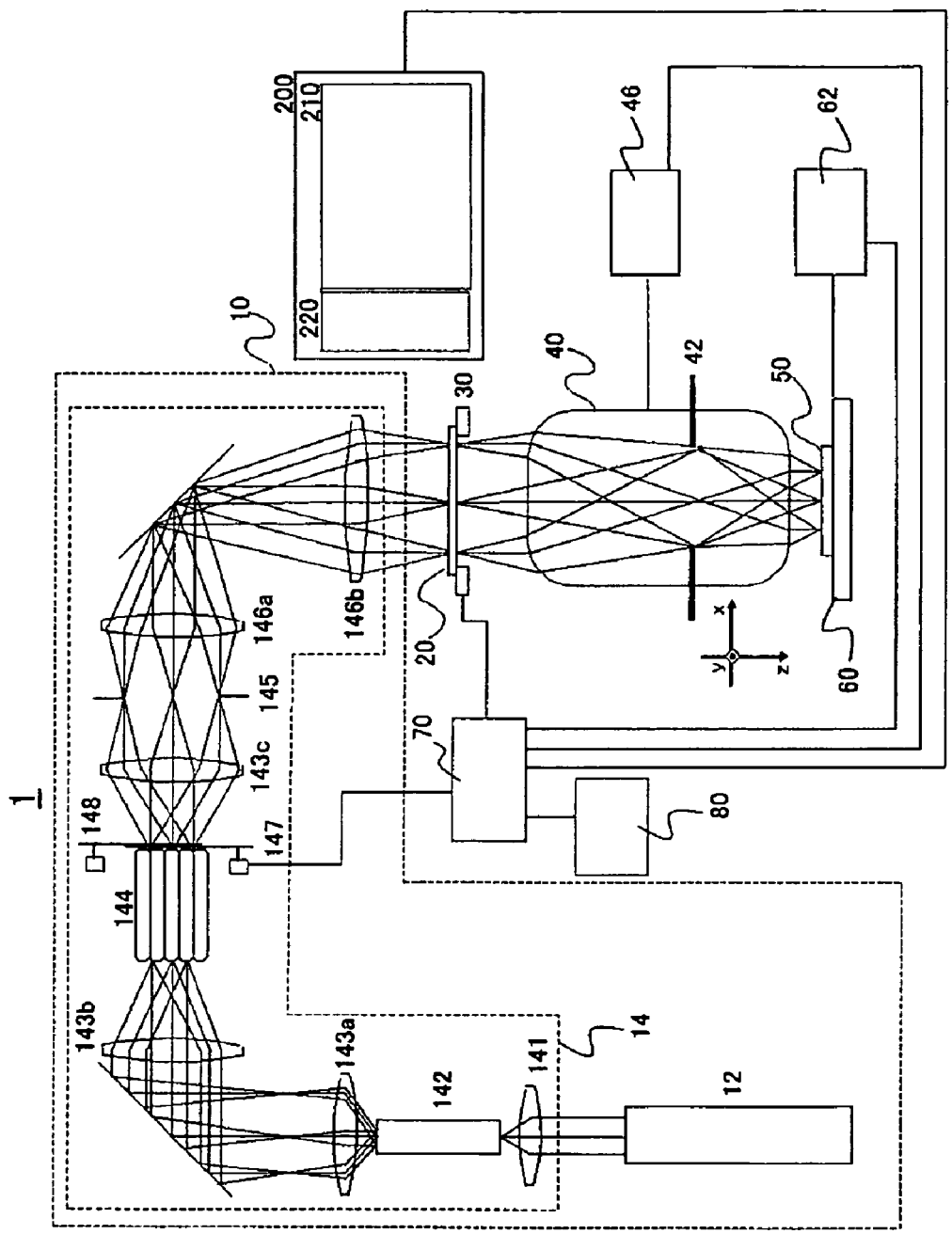
FIG. 1 is a schematic sectional view of an exposure apparatus according to one aspect of the present invention.

Referring now to the accompanying drawings, a description will now be given of an exposure apparatus and method according to one aspect of the present invention. In each figure, like elements are designated by like reference numerals, and a duplicate description thereof will be omitted. Here, FIG. 1 is a schematic sectional view of the inventive exposure apparatus 1.

The exposure apparatus 1 is a projection exposure apparatus that exposes onto the plate 50 a circuit pattern of the reticle 20, e.g., in a step-and-scan manner. The exposure apparatus can apply a step-and-repeat manner. This exposure apparatus is suitable for a sub-micron or quarter-micron lithography process, and this embodiment exemplarily describes a step-and-scan exposure apparatus (which is also called a "scanner"). The "step-and-scan manner," as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

The exposure apparatus 1 includes, as shown in FIG. 1, an illumination apparatus 10, a reticle stage 30 for supporting the reticle 20, a projection optical system 40, a wafer stage 60 for supporting the plate 50, a controller 70, and a memory 80.

The illumination apparatus 10 illuminates the reticle 20 that has a circuit pattern to be transferred, and includes a light source unit 12 and an illumination optical system 14.

The light source unit 12 uses as a light source, for example, as an ArF excimer laser with a wavelength of approximately 193 nm, and a KrF excimer laser with a wavelength of approximately 248 nm. However, a type of laser is not limited to excimer laser, and the light source unit 12 may use the $F_2$ laser with a wavelength of approximately 153 nm. In addition, the number of laser units is not limited. For example, two independently acting solid lasers would cause no coherence between these solid lasers and reduce speckles resulting from the coherence. An optical system for reducing speckles may swing linearly or rotationally.

The illumination optical system 14 is an optical system that illuminates the reticle 20, and includes a lens, a mirror, a light integrator, a stop, and the like. The illumination optical system 14 in this embodiment illuminates the reticle 20 with a light of a polarization state optimal to the pattern of the reticle 20. The illumination optical system 14 includes, as shown in FIG. 1, a lens 141, an internal reflection mirror 142, collimator lenses 143a and 143b, and a fly-eye lens 144, a stop 145, imaging optical systems 146a and 146b, a polarizer switch 147, and an aperture switch 148.

The lens 141 introduces the light to the internal reflection mirror 142 from the light source unit 12 at a desired angle, and makes the light intensity uniform with the internal reflection mirror 142. The internal reflection mirror 142 reflects the incident light plural times on its internal surfaces and makes uniform the light intensity distribution at its exit plane although the light intensity is non-uniform at the incident plane.

The collimator lenses 143a and 143b project the exit plane of the internal reflection mirror 142 onto the incident plane of the fly-eye lens while enlarging or reducing the size of the exit plane. The fly-eye lens 144 forms plural condensing points on its exit plane. The collimator lens 143c illuminates the stop 145 at a uniform light intensity distribution using the multiple condensing points formed by the fly-eye lens 144 as a secondary light source.

The stop 145 restricts the illumination area of the target surface to be illuminated or reticle 20 in this embodiment, and is illuminated at a uniform light intensity distribution by the collimator lens 143c using the multiple condensing points formed by the fly-eye lens 144 as a secondary light source. The imaging optical systems 146a and 146b are imaging optical systems that set a position of the stop 145 to an object plane, and a position of the reticle 20 to an image plane. The imaging optical systems 146a and 146b projects the uniform illumination distribution realized at the position of the stop 145 onto the reticle 20, and illuminates the reticle 20 at a uniform light intensity.

The polarizer switch 147 defines the polarization state of the light that illuminates the reticle 20, and includes, as shown in FIGS. 2A to 2D, polarizers 147a to 147c and a transmission hole 147d on a turret. A controller 70, which will be described later, can arbitrarily switch the turret. The coordinate system in FIGS. 2A to 2D is a right-hand system that sets to the Z axis an optical-axis direction from the light source unit 12 to the reticle 20. The polarizer 147a controls the polarization state of the light that illuminates the reticle 20, in the y direction. The polarizer 147b controls the polarization state of the light that illuminates the reticle 20, in the x direction. The polarizer 147c controls the polarization state of the light that illuminates the reticle 20 so that the polarization direction of the effective light source vibrates in a tangential direction as shown in FIG. 3. No polarizer is set to the transmission hole 147d, and the transmission hole 147d does not control the polarization state (randomly polarized light). Here, FIGS. 2A to 2D are schematic plane views of the illustrative polarizers 147a, 147c and the transmission hole 147d, which the polarizer switch 147 possesses on the turret. FIG. 3 is a schematic plane view showing the polarization state of the light controlled by the polarizer 147c within the effective light source.

The polarizer switch 147 in this embodiment changes, according to the pattern of the reticle 20, the polarization state of the light from the light source unit 12 to the optimal one so that the diffracted lights from the reticle 20 has the parallel electric-field vibration planes on the imaging point on the plate 50). For example, the diffracted light spreads on the x section for a periodic pattern on the x section as shown in FIG. 4A, and the y-polarized light illumination is suitable with the polarizer 147a (FIG. 2A) that controls a polarization state in the y direction. The diffracted light spreads on the y section for a periodic pattern on the y section as shown in FIG. 4B, and the x-polarized light illumination is suitable with the polarizer 147a (FIG. 2B) that controls a polarization state in the x direction. The tangentially polarized light illumination with the polarizer 147c (FIG. 2C) that controls a polarization state concentrically is optimal to a pattern that extends in arbitrary directions as shown in FIG. 4C. Here, FIGS. 4A to 4C are schematic plane views of illustrative patterns of the reticle 20 with a coordinate system similar to that of FIGS. 2A to 2D.

The aperture switch 148 defines an effective light source distribution, and includes, as shown in FIGS. 5A to 5F, apertures 148a to 148f on a turret. The controller 70, which will be described later, can arbitrarily switch the turret. FIGS. 5A to 5F are schematic plane views of the aperture switch 148 that has the illustrative apertures 148a to 148f on the turret with a coordinate system similar to that of FIGS. 2A to 2D. The apertures 148a to 148f are used for a large σ illumination, a small σ illumination, a dipole illumination in the x direction, a dipole illumination in the y direction, a quadrupole illumination and an annular illumination.

The reticle 20 can be illuminated with a desired polarization state and an effective light source distribution by properly combining the polarizers 147a to 147c in the polarizer switch 147 and the apertures 148a to 148f in the aperture switch 148. The effective light source distribution is variable by zooming the collimator lens 143b instead of the aperture switch 147, by providing a switchable and zoomable input lens between the internal reflection mirror 142 and the collimator lens 143a, or by using a phase-type computer generated hologram ("CGH").

The reticle 20 is fed from the outside of the exposure apparatus 1 by the reticle feed system 200, and is supported and driven by the reticle stage 30. The reticle 20 is made, for example, of quartz, and has a circuit pattern to be transferred. The diffracted light emitted from the reticle 20 passes the projection optical system 40, and is projected onto the plate 50. The reticle 20 and the plate 50 are located in an optically conjugate relationship. Since the exposure apparatus 1 of this embodiment is a scanner, the reticle 20 and the plate 50 are scanned at the speed ratio of the reduction ratio, thus transferring the pattern on the reticle 20 to the plate 50. The reticle feeding system 200 includes a reticle cassette 210 that accommodates plural reticles 20, and a reticle feeder 220 that feeds the reticle 20. The reticle feeding system 200 feeds the reticle 20 stored in the reticle cassette 210 to the reticle stage 30 through the reticle feeder 220. It is preferable to optimize the polarization state and the effective light source distribution of the light for illuminating the reticle 20 in accordance with the pattern of the reticle 20 fed by the reticle feeding system 200.

The reticle stage 30 supports the reticle 20 via a reticle chuck (not shown), and is connected a moving mechanism (not shown). The moving mechanism (not shown) includes a linear motor, etc., and drives the reticle stage 30 to move the reticle 20 in the XYZ directions and rotating directions around these axes.

The projection optical system 40 is an optical system that images the light from the object plane, such as the reticle 20, onto an exposure area of the image plane, such as the plate 50. The projection optical system 40 may use a dioptric optical system solely including a plurality of lens elements, a catadioptric optical system including a plurality of lens elements and at least one mirror, and a full mirror type or catoptric optical system, and so on. The projection optical system 30 has a stop 42 near the pupil to control the NA, and this embodiment sets a NA to 0.9 or greater. An aberration adjusting mechanism 46 for adjusting the aberration of the projection optical system 40 is attached to at least one of the optical elements in the projection optical system 40.

The aberration adjusting mechanism 46 is, for example, a mechanism that drives a lens or lens group in the projection optical system 40 in the optical-axis direction, a mechanism that inclines one or more lens in the projection optical system 40 relative to the optical axis at an arbitrary angle, a mechanism that decenters one or more lens from the optical axis, or a mechanism that deforms a lens. The aberration adjusting mechanism 46 is controlled by the controller 70, which will be described later, and corrects the aberration of the projection optical system 40, which has been varied as a result of a change of the polarization state of the light for illuminating the reticle 20.

The plate 50 is a wafer in this embodiment, but may broadly cover a liquid crystal plate and an object to be exposed. A photoresist is applied onto the plate 50.

The wafer stage 60 supports the plate 50 via a wafer chuck (not shown). The wafer stage 60 is connected to a moving mechanism 62, such as a linear motor. Similar to the reticle stage 30, the moving mechanism 62 can move the plate 50 in XYZ directions and rotating directions around these axes. The moving mechanism 62 is controlled by the controller 70, which will be described later, and moves the plate 50, for example, to a focal point position or image plane position that varies as a result of a change of the polarization state of the light for illuminating the reticle 20.

The controller 70 is electrically connected to the polarizer switch 147 and aperture switch 148 in the illumination apparatus 10, a moving mechanism (not shown) in the reticle stage 30, the reticle feeding system 200, the aberration adjusting mechanism 46, the moving mechanism 62 of the wafer stage 60 so as to controls operations of the exposure apparatus 1. The controller 70 controls the aberration adjusting mechanism 46 and the moving mechanism 62 of the wafer stage 60 to optimize the aberration of the projection optical system 40, which has varied when the polarization state of the light for illuminating the reticle 20 is switched and the reticle 20 is exchanged. In other words, the controller 70 corrects and optimize the aberration and image plane position of the projection optical system and the alignment error between the reticle 20 and the plate 50, as described later in detail, via the aberration adjusting mechanism 46 and the moving mechanism 62 of the wafer stage 60. The aberrational variation of the projection optical system 40 is detectable by detecting the aberration of the projection optical system 40 and by referring to an aberrational table stored in the memory 80, whenever the polarization state is switched. An exchange of the reticle 20 is detectable when the reticle feeding system 200 informs the controller 70 of the exchange of the reticle 20. The controller 70 also obtains the pattern shape of the exchanged reticle 20, in particular the periodic direction of the pattern, and controls the polarization switch 147 and the aperture switch 148 so as to illuminate the reticle 20 with the light having the best polarization state and the effective light source distribution.

The memory 80 stores an aberrational table that correlates the polarization state of the light for illuminating the reticle 20 with the arbitration of the projection optical system 40, for example, for each lens unit in the projection optical system 40. The aberrational table may include, for example, data of a spherical aberrational variation amount, a coma variation amount, a astigmatism variation amount, a distortion variation, a defocus amount, and a pattern's positional shift variation amount, when the x-polarized light is switched to the y-polarized light, the coma variation. Alternatively, the aberrational table may be a Zernike coefficient in the Zernike polynomial.

A description will be given of an exposure method using the exposure apparatus 1. The inventive exposure method is characterized in always correcting the aberration of the projection optical system 40 to the optimal state for exposure. When a change of the pattern of the reticle 20 is detected, the polarizer switch 147 switches to the polarization state optimal to the pattern of the reticle 20.

When the polarization state is switched, the aberration of the projection optical system 40 varies and thus the aberration adjusting mechanism 46 adjusts so as to optimize the aberrational amount of the projection optical system 40. The aberrational variation amount of the projection optical system 40 to be corrected is obtained by previously measuring the aberrational variation amount at each polarization state of the light for illuminating the reticle 20, or by measuring the aberration through a measuring mechanism, such as a shearing interferometer and a point diffraction interferometer, provided in the exposure apparatus 1, which measures the aberration of the projection optical system 40 whenever the polarization state is switched and calculating the aberrational variation amount based on the measurement result.

When the polarization state of the light for illuminating the reticle 20 is switched, the image plane position of the projection optical system 40 changes. Accordingly, the wafer stage 60 moves the plate 50 to the best image plane position along the optical-axis direction. The image-plane position may be previously measured at each polarization state of the light for illuminating the reticle 20, and the moving amount of the wafer stage 60 in the optical-axis direction may be calculated. Alternatively, the image-plane position may be measured through the TTL ("through-the-lens") autofocus mechanism in the exposure apparatus 1 whenever the polarization state is switched, and the moving amount of the wafer stage 60 in the optical-axis direction may be calculated based on the measurement result.

When the polarization state of the light for illuminating the reticle 20 is switched, an alignment shifts between the reticle 20 and the plate 50. Accordingly, the wafer stage 60 is moved on the xy plane to correct the alignment shift. An alignment shift amount between the reticle 20 and the plate 50 may be previously measured at each polarization state of the light for illuminating the reticle 20, and the moving amount of the wafer stage 60 on the xy plane may be calculated. Alternatively, an alignment shift amount may be measured through the alignment measuring mechanism (not shown) in the exposure apparatus 1 whenever the polarization state is switched, and the moving amount the wafer state 60 on the xy plane may be calculated based on the measuring result.

Figure 6:
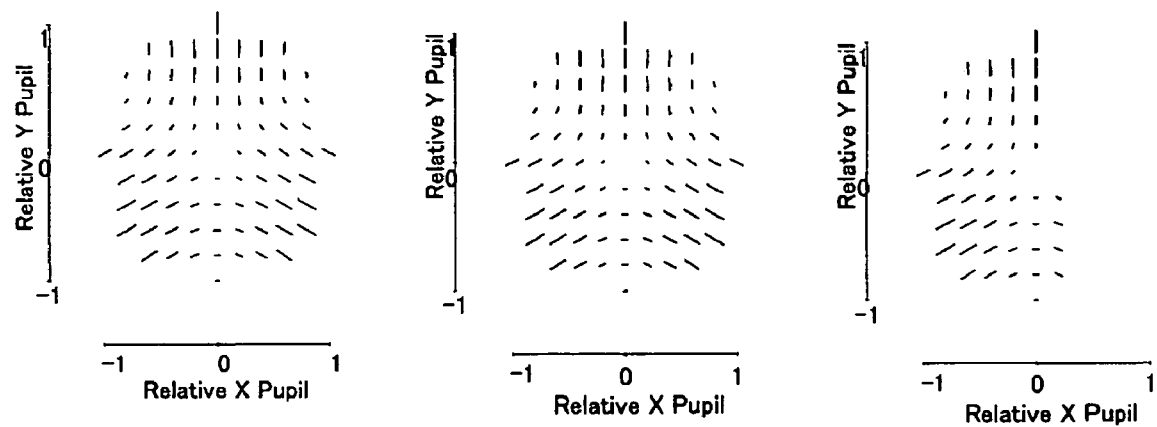
FIG. 6 is a view of a fast phase axis in the intrinsic birefringence in a calcium fluoride, 8.5 mm thick plane-parallel plate above a wafer in the projection optical system having a numerical aperture ("NA") of 0.9.

A concrete description of the correction to the aberration of the projection optical system 40 will be given in an illustration where the projection optical system 40 has an NA of 0.9, and a 5-mm thick plane-parallel plate is placed above the plate 50 and made of calcium fluoride ("CaF$_2$") of isometric crystal. CaF$_2$ has an intrinsic birefringence depending upon an incident angle of the light, and it is 3.4 [nm/cm] at maximum to the wavelength of the ArF excimer laser. Since the projection optical system 40 is telecentric at both sides of the reticle 20 and the plate 50, the incident angle distribution of the light upon the plane-parallel plate above the plate 50 is uniquely determined once the NA and image point are determined. The plane-parallel plate is set so that the [1 1 1] axis relating to the crystal orientation of CaF$_2$ orientates in the optical-axis direction, and the projection direction of the [1 0 0] axis of the crystal orientation upon the xy plane accords with the y axis. FIG. 6 shows a fast phase axis of the plane-parallel plate. Although the actual exposure apparatus is subject to the influence of the birefringence due to the residue stress in the glass material manufacturing time, the mechanical stress, and antireflection coating and reflection coating, this embodiment assumes that such influence is negligible to simplify the description.

Figure 7:
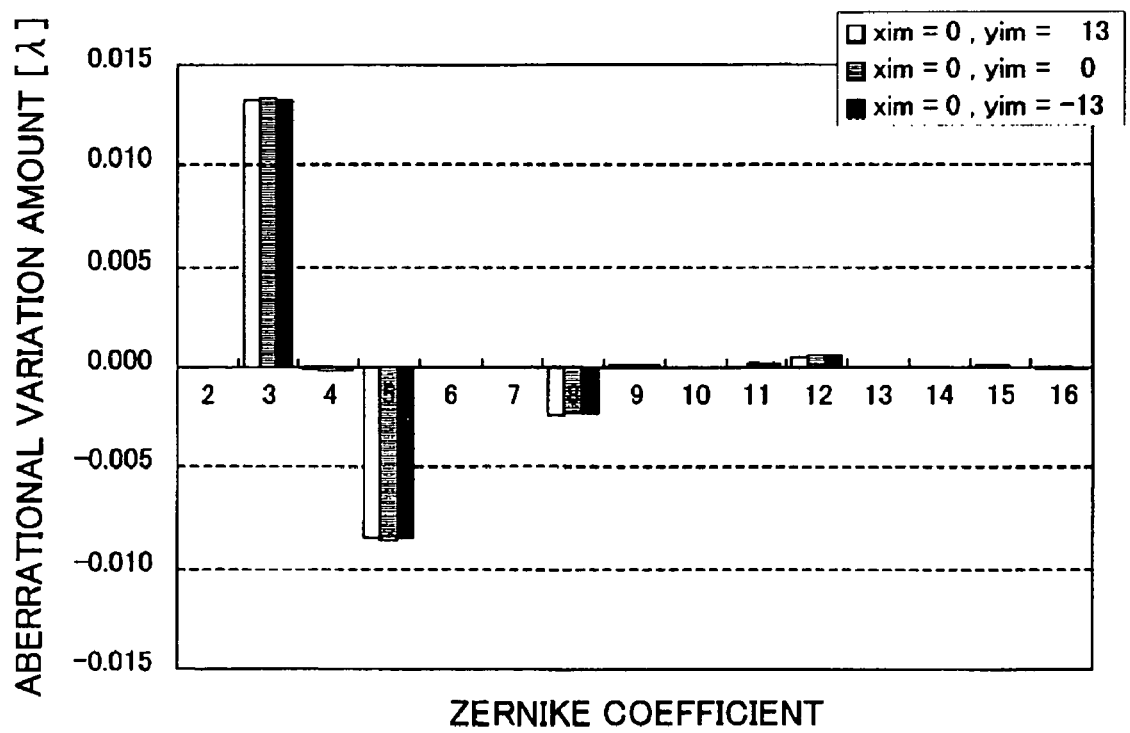
FIG. 7 is a graph showing an aberrational difference between the x-polarized light illumination and the y-polarized light illumination in the projection optical system having the fast phase axis shown in FIG. 6.

When the polarization state of the light for illuminating the reticle 20 is switched from the y-polarized light to the x-polarized light, the projection optical system 40 that is assumed to have a fast phase axis shown in FIG. 6 exhibits the aberrational variation shown in FIG. 7. FIG. 7 is a graph of the aberrational variation amount on the pupil plane in the projection optical system 40, fitted by the Zernike polynomial, where the abscissa axis denotes the Zernike coefficient, and the ordinate axis denotes the aberrational variance amount when the polarization state is switched. The Zernike polynomial uses a polar coordinate $(R, \theta)$ as a coordinate system, and the Zernike cylindrical function as the orthogonal function system. The aberrational variance amount $W(R, \theta)$ is expressed by Equation 7 below, where $C_i$ is a coefficient of each term in the Zernike polynomial, and $Z_i$ is a Zernike cylindrical function as indicated in Table 1 below:

$$W(R, \theta) = \Sigma C_i \cdot Z_i \quad (7)$$

TABLE 1

| Z1 | 1 |
|---|---|
| Z2 | $R \cos \theta$ |
| Z3 | $R \sin \theta$ |
| Z4 | $2R^2 - 1$ |
| Z5 | $R^2 \cos 2\theta$ |
| Z6 | $R^2 \sin 2\theta$ |
| Z7 | $(3R^3 - 2R)\cos \theta$ |
| Z8 | $(3R^3 - 2R)\sin \theta$ |
| Z9 | $(6R^4 - 6R^2 + 1)$ |
| Z10 | $R^3 \cos 3\theta$ |
| Z11 | $R^3 \sin 3\theta$ |
| Z12 | $(4R^4 - 3R^2)\cos 2\theta$ |
| Z13 | $(4R^4 - 3R^2)\sin 2\theta$ |
| Z14 | $(10R^5 - 12R^3 + 3R)\cos \theta$ |
| Z15 | $(10R^5 - 12R^3 + 3R)\sin \theta$ |
| Z16 | $(20R^6 - 30R^4 + 12R^2 - 1)$ |

This embodiment contemplates a switch to a differently polarized light illumination from a polarized light illumination that combines the polarizer 147a shown in FIG. 2A with the aperture 148c shown in FIG. 5C for the pattern shown in FIG. 4A having a period only in the x direction. The differently polarized light illumination state combines the polarizer 147b shown in FIG. 2B with the aperture 148c shown in FIG. 5D, and exchanges the pattern to the pattern shown in FIG. 4B that has a period only in the y direction. Then, the aberrational amount of the projection optical system 40 varies, as shown in FIG. 7, and thus should be corrected to the optimal one.

For example, the in-slit uniform Zernike coefficient C5 shown in FIG. 7 is an astigmatism component that changes the optimal imaging position of a periodic pattern in the y direction and a periodic pattern in the x direction. Accordingly, the in-slit uniform astigmatism component is corrected by inclining two plane-parallel plates under the reticle 20 in opposite directions with respect to the optical axis in the projection optical system 40 or by adding a predetermined amount of a shape change of the Zernike cylindrical function Z5 to the lens near the pupil in the projection optical system 40.

A periodic pattern on the reticle 20 is often limited for an illumination of a linearly polarized light. When the pattern's periodic structure is limited to a specific direction, only the aberration on the specific section through which the diffracted light passes may be reduced. Therefore, instead of correcting the astigmatism component of the pupil, the plate 50 is moved to the best imaging position to the pattern in the specific direction by moving the wafer stage 60 in the z direction.

The in-slit uniform Zernike coefficient C3 generates a positional shift between the reticle 20 and the plate 50, and deteriorates the alignment accuracy. Accordingly, when the polarization state of the light for illuminating the reticle 20 is switched, the wafer stage 60 is moved on the xy plane to correct the positional shift between the reticle 20 and the plate 50.

In order to correct the in-slit uniform Zernike coefficient C8, the projection optical system 40's lens is adjusted or decentered in parallel. Alternatively, a predetermined amount of a shape change of the Zernike cylindrical function Z8 may be added to the mirror near the pupil in the projection optical system 40.

The aberrational variation of the in-slit Zernike coefficient C10 occurs when the polarized light illumination that combines the polarizer shown in FIG. 2C with the aperture 148f shown in FIG. 5F. This is correctible by adding a predetermined amount of a shape change of the Zernike cylindrical function Z10 to the lens and mirror near the pupil in the projection optical system 40.

This embodiment addresses the intrinsic birefringence of CaF$_2$. Indeed, the aberration varies in the projection optical system 40 when the polarization state of the light for illuminating the reticle 20 is switched, due to the residue stress in the glass material manufacturing time, the mechanical stress, and antireflection coating and reflection coating. Then, various aberrations occur, such as a spherical aberration, a coma, astigmatism, a magnification, and a distortion. This embodiment is not limited to the above correcting method of the aberration of the projection optical system 40 but may cover driving, decentering or parallel decentering in the optical-axis direction, of one or more arbitrary lenses, as long as the aberrational amount is optimal. A provision of an arbitrary shape deformation to a lens or mirror of the projection optical system 40 is also viable to correct the aberration. The image plane position and the positional shift between the reticle 20 and the plate 50 can be corrected as described above.

It is unnecessary to correct the entire pupil in order to correct the aberration of the projection optical system 40. For example, when the apertures 148c and 148d shown in FIGS. 5C and 5D are used, used part in the pupil in the projection optical system 40 is limited to a specific section that allows the diffracted light to pass and defines the effective light source. Therefore, only the used part may be corrected on the pupil section in the projection optical system 40.

In addition, when the post-exchange reticle pattern has a periodic structure in the same direction as that of the pre-exchange reticle pattern, the polarization state of the reticle illuminating light does not have be switched. If the post-exchange reticle pattern pitch differs from the pre-exchange reticle pattern pitch even though the pattern's periodic direction is the same, the diffracted light distribution changed on the pupil plane in the projection optical system. Then, it is necessary to correct the specific part on which the diffracted light distributes on the pupil plane in the projection optical system.

Thus, the inventive exposure apparatus and method can maintain the aberration of the projection optical system optimal even when the polarization state of the reticle illuminating light is switched, and allows a fine pattern to be precisely transferred without deteriorating the imaging performance. While this embodiment illustrates an exposure apparatus having a projection optical system that applies isometric crystal to a plane-parallel plate, the present invention is not limited to this embodiment and covers an exposure apparatus having a projection optical system that uses isometric crystal for a lens having a power, and an exposure apparatus having a projection optical system that does not contain isometric crystal.

When a polarizer is used to turn the reticle illuminating light to a specific polarization state, the illumination efficiency deteriorates and the throughput lowers. On the other hand, a large angle between interfering lights or a high NA of the projection optical system enhances an effect to illuminate the reticle with the specific polarization state. In other words, a low NA of the projection optical system has little effect on the polarization controlled illumination. Therefore, an NA of 0.90 or greater that has a remarkable effect of the polarization controlled illumination. For example, an immersion lithography apparatus is preferable which fills a space between a final lens surface of the projection optical system (closest to the optical system) and the plate with a material (liquid) having a refractive index greater than that of the air. Suppose a correction of the Petzval sum necessary to correct the image plane in the immersion lithography apparatus that has a projection optical system with an NA greater than 1.2 that has a more conspicuous effect of the polarization controlled illumination. The dioptric optical system causes a very large diameter. Therefore, a catadioptric optical system is preferable which includes at least one mirror and enables a correction of the Petzval sum without enlarging the diameter.

In exposure, light emitted from the light source unit 12, e.g., Koehler-illuminates the reticle 20 after the illumination optical system 14 turns the light into the optimal polarization state and effective light source distribution. The light that passes the reticle 20 and reflects the reticle pattern is imaged on the plate 50 by the projection optical system 40. Since the aberration of the projection optical system 40 used for the exposure apparatus 1 is always maintained optimal, the exposure apparatus 1 exhibits an excellent imaging performance, and provides devices (such as semiconductor devices, LCD devices, image pickup devices (such as CCDs, etc.), thin film magnetic heads, and the like) at a high throughput and economical efficiency.

Figure 8:
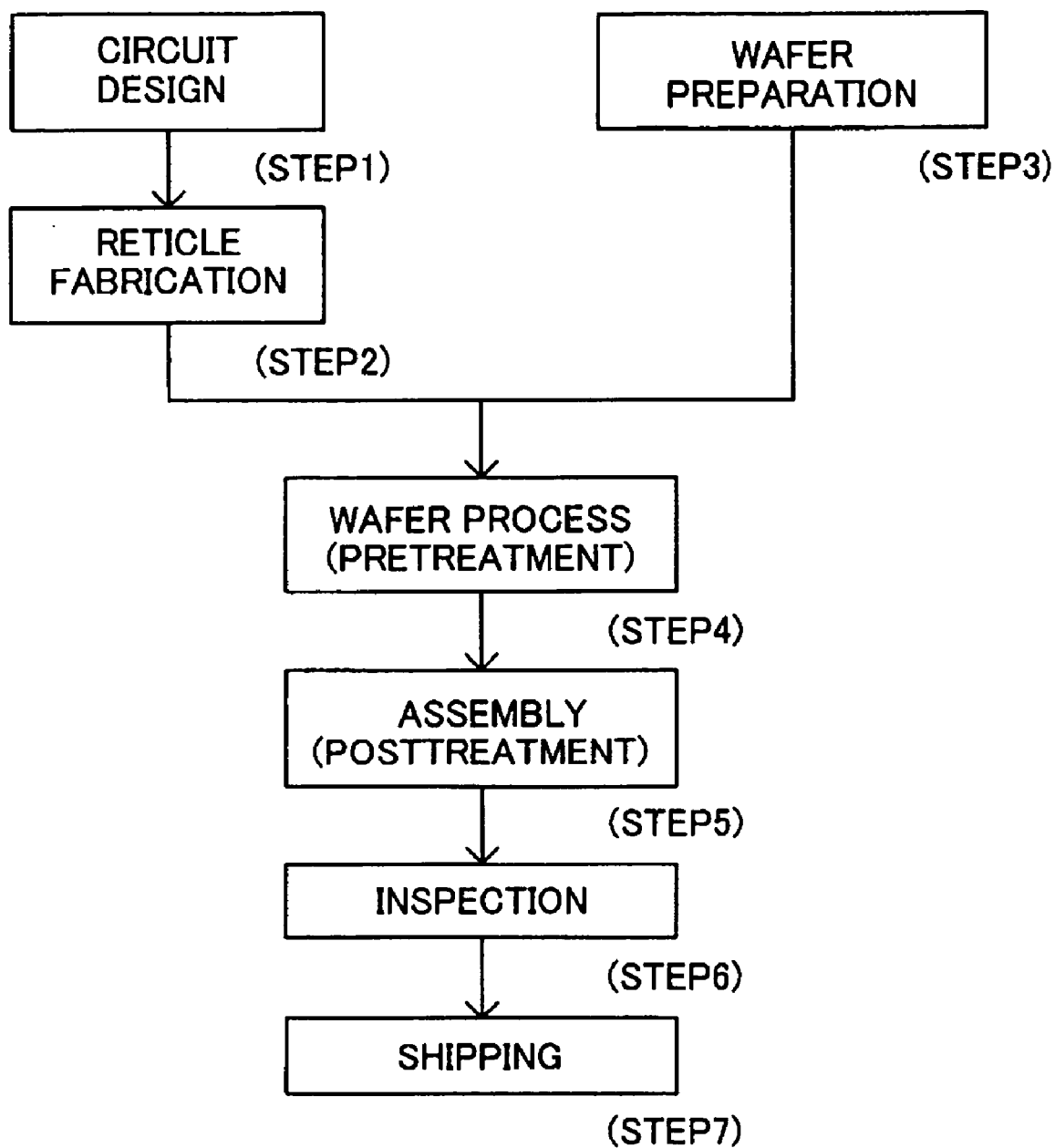
FIG. 8 is a flowchart for explaining manufacture of devices (such as semiconductor chips such as ICs and LCDs, CCDs, and the like).
Figure 9:
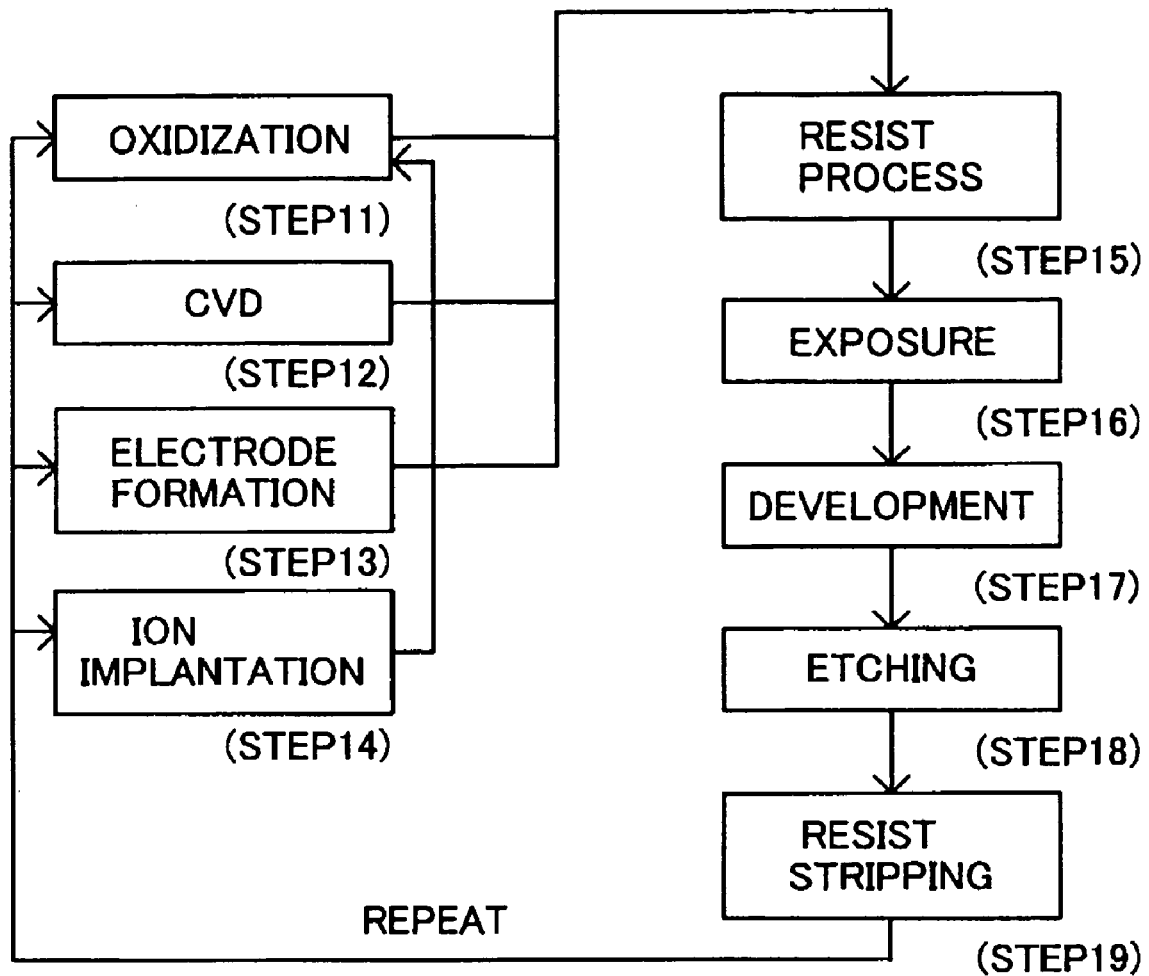
FIG. 9 is a detail flowchart of a wafer process as Step 4 shown in FIG. 8.
Figure 10:
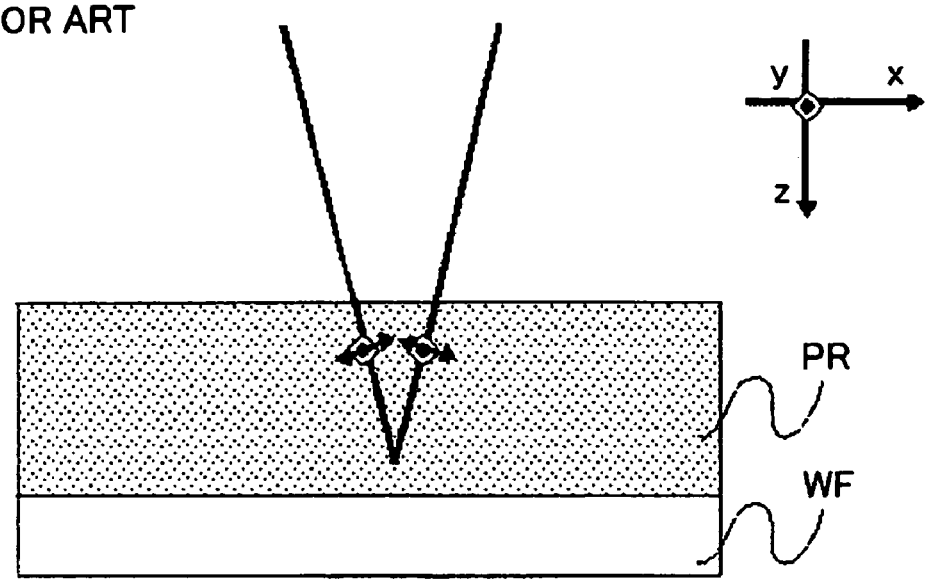
FIG. 10 is a schematic view of interference between two lights on a wafer with a low NA.
Figure 11:
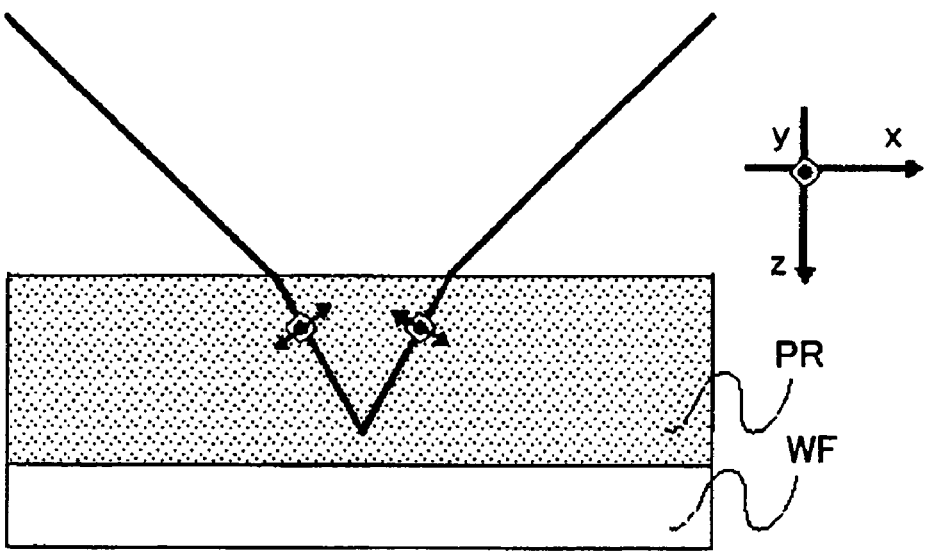
FIG. 11 is a schematic view of interference between two lights on a wafer with a high NA.

Referring now to FIGS. 8 and 9, a description will be given of an embodiment of a device manufacturing method using the above exposure apparatus 1. FIG. 8 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms actual circuitry on the wafer through lithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist separation) removes disused resist after etching. These steps are repeated, and multi-layer circuit patterns are formed on the wafer. Use of the fabrication method in this embodiment helps fabricate higher-quality devices than ever. The device manufacturing method that uses the exposure apparatus 1 and resultant devices constitute one aspect of the present invention.

Further, the present invention is not limited to these preferred embodiments, and various variations and modifications may be made without departing from the scope of the present invention. For example, the present invention is applicable to a step-and-repeat exposure apparatus (also referred to as a "stepper"), which exposes the wafer while maintaining stationary the reticle and the wafer.

This application claims a foreign priority benefit based on Japanese Patent Application No. 2004-362668 filed on Dec. 15, 2004, which is hereby incorporated by reference herein in its entirety as if fully set forth herein.

What is claimed is:

1. An exposure apparatus for exposing a pattern of a reticle onto a plate, said exposure apparatus comprising:
   a projection optical system for projecting the pattern onto the plate;
   a switch for switching a polarization of a light for illuminating the reticle from a first polarization state to a second polarization state different from the first polarization state; and
   an adjuster for adjusting an aberration of said projection optical system when said switch switches the polarization of the light from the first polarization state to the second polarization state,
   wherein said adjuster adjusts an aberration of only a specific part that a diffraction light from the reticle passes through on a pupil plane in said projection optical system.

2. An exposure apparatus according to claim 1, wherein said adjuster adjusts the aberration of only the specific part which is specified based on a periodic structure of the pattern of the reticle or an effective light source distribution.

3. An exposure apparatus according to claim 1, further comprising:
   a measuring unit for measuring the aberration of said projection optical system; and
   a controller for controlling said adjuster based on a measurement result by said measuring unit.

4. An exposure apparatus according to claim 1, further comprising:

a memory for storing a table that correlates the polarization state of the light for illuminating the reticle with the aberration of said projection optical system; and a controller for controlling said adjuster based on the table stored in the memory.

5. An exposure apparatus for exposing a pattern of a reticle onto a plate, said exposure apparatus comprising:

a projection optical system for projecting the pattern onto the plate;

a detector for detecting a change of the pattern of the reticle; and an adjuster for adjusting an aberration of said projection optical system when said detector detects the change of the pattern of the reticle, wherein said adjuster adjusts an aberration of only a specific part that a diffraction light from the reticle passes through on a pupil plane in the projection optical system.

6. An exposure method for exposing a pattern of a reticle onto a plate through a projection optical system, said exposure method comprising the steps of:

detecting a change of a polarization state of a light for illuminating the pattern of the reticle;

obtaining a variation of an aberration of the projection optical system caused by the change of the polarization state of the light; and adjusting the aberration of the projection optical system based on a result obtained by said obtaining step, wherein said adjuster adjusts an aberration of only a specific part that a diffraction light from the reticle passes through in said projection optical system.

7. An exposure method for exposing a pattern of a reticle onto a plate through a projection optical system, said exposure method comprising the steps of:

detecting a change of the pattern of the reticle;

obtaining a variation of an aberration of the projection optical system caused by the change of the pattern of the reticle; and adjusting the aberration of the projection optical system based on a result obtained by said obtaining step, wherein said adjuster adjusts an aberration of only a specific part that a diffraction light from the reticle passes through in said projection optical system.

8. A device manufacturing method comprising the steps of:

exposing a plate using an exposure apparatus; and developing a plate that has been exposed wherein said exposure apparatus exposes a pattern of a reticle onto a plate and said exposure apparatus comprises:

a projection optical system for projecting the pattern onto the plate;

a switch for switching a polarization of a light for illuminating the reticle from a first polarization state to a second polarization state different from the first polarization state; and an adjuster for adjusting an aberration of said projection optical system when said switch switches the polarization of the light from the first polarization state to the second polarization state, wherein said adjuster adjusts an aberration of only a specific part that a diffraction light from the reticle passes through on a pupil plane in said projection optical system.

* * * * *